United States Patent [19]

Jones

[11] Patent Number: 5,126,656
[45] Date of Patent: Jun. 30, 1992

[54] BURN-IN TOWER

[75] Inventor: Elmer R. Jones, North Reading, Mass.

[73] Assignee: EJ Systems, Inc., Lawrence, Mass.

[21] Appl. No.: 708,872

[22] Filed: May 31, 1991

[51] Int. Cl.⁵ .................... G01R 31/02; H05B 1/00
[52] U.S. Cl. ................... 324/158 F; 219/209; 324/73.1
[58] Field of Search ......... 324/158 F, 158 P, 73 T, 324/158 R, 501; 219/209, 210; 307/149

[56] References Cited

U.S. PATENT DOCUMENTS

| | | | |
|---|---|---|---|
| 3,656,058 | 4/1972 | Leathers | 324/158 F |
| 4,145,620 | 3/1979 | Dice | 307/149 |
| 4,503,335 | 3/1985 | Takahashi | 324/158 F |
| 4,777,434 | 10/1988 | Miller et al. | 219/209 |
| 5,001,423 | 3/1991 | Abrami et al. | 324/158 F |

Primary Examiner—Ernest F. Karlsen
Attorney, Agent, or Firm—Samuels, Gauthier & Stevens

[57] ABSTRACT

A burn-in tower having a skeletal frame which defines an outer wall is rotatably secured to a fixed base. A plurality of DUT positions are provided on the surface of the tower. Each DUT position comprises a thermal conductive module and a DUT socket assembly which are releasably engaged on to the other. The temperature of the DUT at each DUT position is controlled independently. The load applied to the DUT at each position may be the same or different. The tower is used at ambient temperatures. In a preferred embodiment, DUT mother boards which contain the driver electronics define the surface or walls of the tower.

12 Claims, 8 Drawing Sheets

BURN-IN TOWER

BACKGROUND OF THE INVENTION

The invention relates to an apparatus for the burn-in of electronic components such as semi-conductors and the like.

Integrated circuits (ICs), after manufacture and prior to use in a computer system, undergo a variety of tests to ensure they are defect free and will perform as intended. One of the tests conducted is known as burn-in.

Test systems for component testing are well known; for example, semi-conductor life tests in burn-in chambers are common. The process of burning-in typically consists of applying a load to the components being tested at elevated temperatures. This allows identification of weak or faulty components and thus precludes their ultimate use, such as in a computer system.

In addition to burn-in ovens or hot air ovens, other technologies used for this purpose are open loop conduction heating, such as hot plates and thermal probes and liquid bath systems.

The burn-in ovens are by far the most prevalent test device and method used. Second in importance are the liquid burn-in bath methods.

In order to apply a load to the components under test, driver electronics are used which must be isolated from the hot thermal environment of the high temperature oven or liquid bath. This means that the driver electronics must be some distance from the devices under test (DUTs) which compromises frequency limits. Further, DUT trays must be high temperature material which adds to the costs of the testing procedure. The burn-in ovens, or forced air systems, typically have plus or minus 3° C. gradients throughout the chamber as required by MIL-STD-883. However, device heat dissipation makes determining the actual case temperatures (and therefore, junction temperatures) very difficult. Materials used in the chamber must be rated at the highest operating temperature, i.e. sockets, capacitors, resistors, connectors and PC board material. Semi-conductors cannot be used on the PC board above 75° C. because of their unreliability at these temperatures. High frequency applications (approximately 5 mHz) requires multi-layer polyimide, PCBs, mother boards, daughter boards and extender boards to be used. High pin count devices require very high I/Os through chamber walls or a compromise must be made. Further, clock cards outside the chamber driving long distances (typically as long as 30 inches) compromise the high frequency operation. In liquid bath systems, the problems are the same as the burn-in ovens. Further, they are more expensive to operate, more inconvenient to operate and clock circuits cannot be put into the bath.

Briefly, some of the common problems with current technology is that the driver electronics are remote from the DUTs. This affects signal quality, the maximum signal frequency that can be used and results in signal skew, cross talk and overshoot. The I/O through the oven walls is not especially suitable for high pin count VLSI components and there is a practical limit to the number of I/Os and the possibility of impairment of signal quality. The trays used in the ovens are expensive, high temperature material. There are temperature variations throughout the oven due to flow dynamics and one is never really sure of the actual DUT junction temperature. Perhaps the most severe problem is the large monolithic ovens are not amenable to small lot burn-in, independent temperature cycling or independent DUT cool down under bias.

It would be desirable to have the driver electronics as close as possible to the DUT preferably located on the burn-in tray and to conduct the burn-in in ambient conditions. Most importantly, accurate independent temperature control of each DUT on a burn-in tray would be desirable.

SUMMARY OF THE INVENTION

Broadly the invention comprises a tower for burn-in of DUTs at ambient (room) temperature. The sockets for the DUTs releasably engage the outer surface of the tower. The tower has within or as part of its walls thermal conductive modules to control the temperature of the DUT, the driver electronics, power packs and other electronics to apply loads to each socket or DUT position and to control the temperature of a thermal conductive module which heats the DUT.

Any or all of the positions may be in use, each at the same or different loads and/or temperature conditions. The conductive module includes a heater and a sensor engages the DUT. Therefore, a separate heat source services each position. Thermal control for each position is via a dedicated microprocessor with the processor set up in turn by a computer. With individual control, each position can be heated to different temperatures over different time intervals. The sensor which reads the temperature of the DUT is isolated from the heater which contacts the DUT. Therefore, the temperature reading is not influenced by the temperature of the heater. Further, the sensor and heater are individually suspended whereby uniform engagement with the DUT is ensured.

In the preferred embodiment, each position is located on the outer surface of the tower. The thermal conductive modules are secured in the surface of the tower. The DUT sockets releasably engage the conductive modules at the DUT positions. The thermal conductive modules are secured to pass through the mother board. The thermal conductive modules are computer controlled by thermal control boards.

The DUT sockets frictionally engage the mother board and electrically communicate therewith. The DUT contacts a sensor on the thermal conductive module. Mother boards containing the DUT clock card with driver electronics are arrayed vertically in the tower in a wall-like configuration and communicate with horizontally-fixed tray backplanes secured in the tower. These backplanes distribute the D voltages to the mother boards which in turn distribute the load to the DUTs. The thermal control boards communicate with thermal backplanes, which thermal backplanes are secured horizontally in the tower. These thermal control boards monitor and control the DUT device case temperature. A communications board provides communication between host computer and the tray and the thermal backplanes.

The tower is an octagon which is secured to a tower bottom. This bottom is rotatably secured on a fixed base. This allows the tower to be rotated and enhances the access to the DUT positions.

Broadly, the invention comprises a burn-in tower having a fixed base. A skeletal frame which defines an outer wall is rotatably secured to the base. A plurality of DUT positions are defined on the surface of the tower. Each DUT position comprises a thermal conductive module and a DUT socket assembly which are releasably engaged one to the other. The temperature of the DUT at each DUT position is controlled independently. Also, the load applied to the DUT at each position may be the same or different. The tower is used at ambient temperatures. In a preferred embodiment, DUT mother boards which contain the driver electronics define the surface or walls of the tower. The thermal conductive module is secured in the tower and extends through an opening in the mother board. The DUT socket assembly comprises a socket, the DUT and a daughter board. The DUT assembly plugs into the mother board whereby the thermal conductive module contacts the DUT. In a particularly preferred embodiment, the tower surface or wall defines an octagon.

DESCRIPTION OF THE PREFERRED EMBODIMENT(S)

A fuller description of a thermal control system which can be used with the invention described herein is described in my copending application entitled Thermal Control System for a SemiConductor Burn-In filed on even date herewith which application is incorporated by reference in its entirety into this disclosure.

Figure 1:
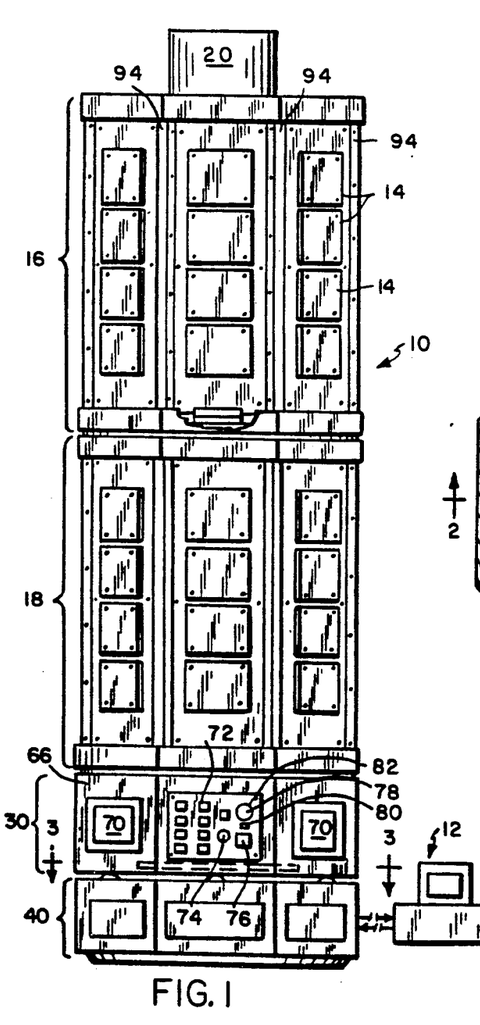
FIG. 1 is a schematic of a tower embodying the invention.

Referring to FIG. 1, a tower embodying the invention is shown generally at 10. The tower communicates with a host computer 12, such as an IBM PS-2. The tower 10 is octogonal and has sixty-four DUT positions for burning-in DUTs. Each of the eight sides of the tower 10 comprises eight identical vertically arrayed DUT burn-in positions 14. The tower includes an upper tower assembly 16 and a lower tower assembly 18, each having thirty-two DUT positions. The assemblies being substantially identical, only one will be described in detail. Disposed on the top of the upper section 16 is a fan assembly 20. The lower section 18 is secured to a tower bottom 30, which in turn is rotatably secured to a fixed base 40.

Figure 2:
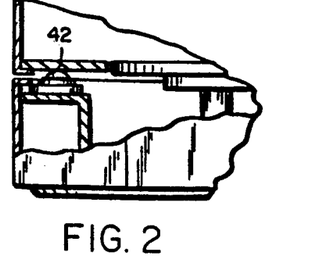
FIG. 2 is a perspective fragmentary view of a fixed base.
Figure 3:
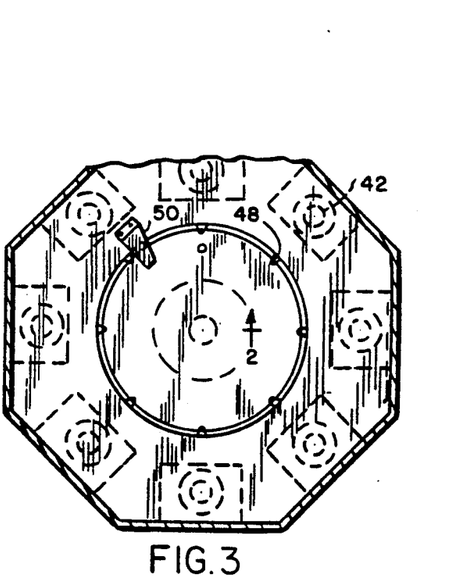
FIG. 3 is a plan fragmentary view of the tower taken along lines 3—3 of FIG. 1.
Figures 4, 5:
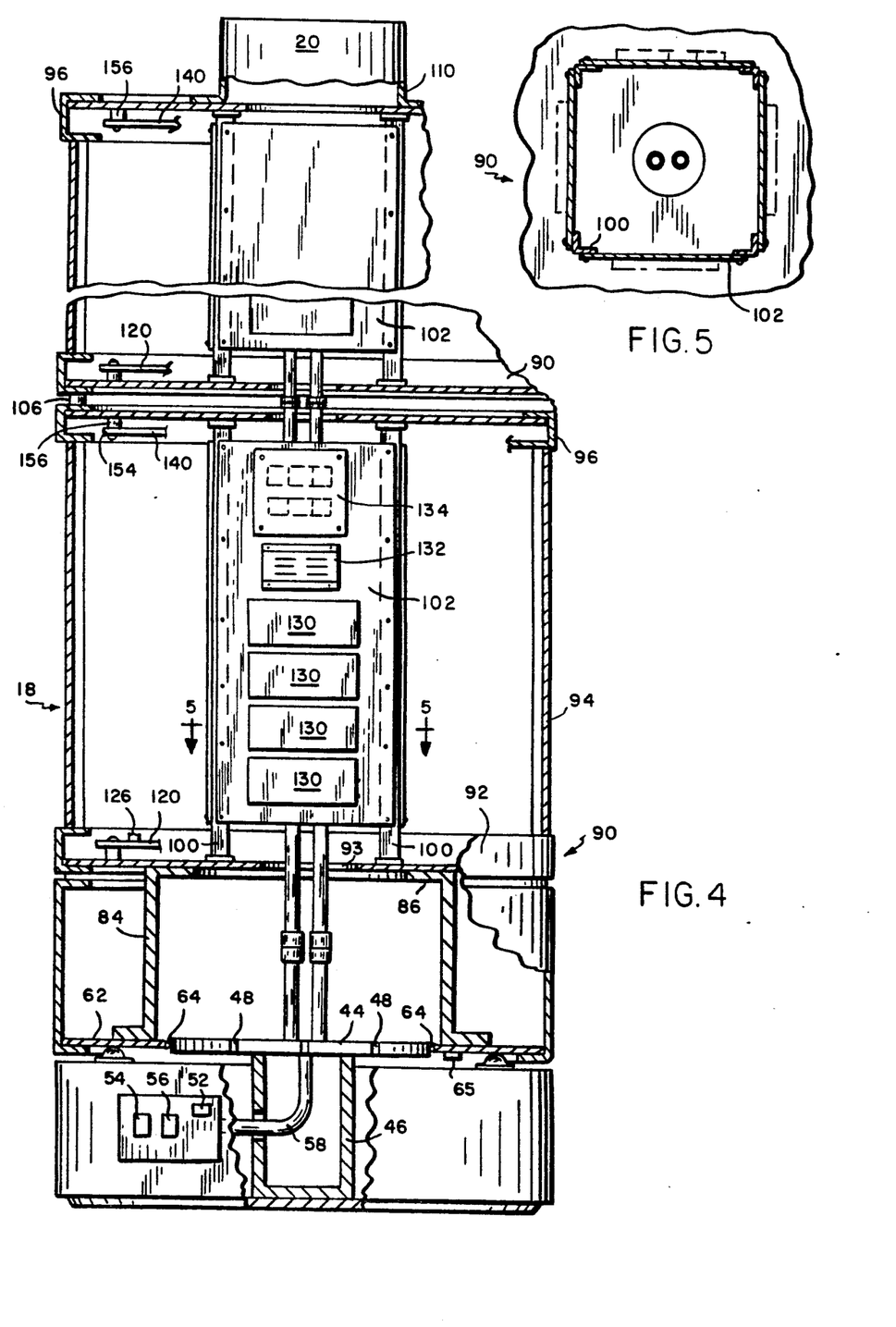
FIG. 4 is a schematic of the tower without mother and daughter boards.
FIG. 5 is a plan view taken along lines 5—5 of FIG. 4.
Figure 6:
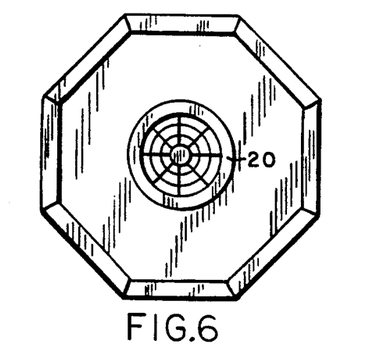
FIG. 6 is a plan view of FIG. 1.

Referring to FIGS. 2, 3 and 4, the base 40 is shown in greater detail and comprises ball bearings 42 and a centrally apertured locator plate 44 supported on legs 46. The locator plate 44 includes peripheral detents 48 and a stop pin 50. Also included in the base 40 are a main switch 52, primary AC power supply inlet 54 and a communications inlet 56 for the host computer 12. A preloaded twist cable 58 is joined to the inlets 54 and 56 and passes through the aperture of the plate 44 and is secured in the bottom 30. The electrical connections ar made to the pre-twisted cable and carried through the tower.

Referring to FIG. 1, the bottom 30 includes apertured walls 66 including switch panel 68 and fan assemblies 70 to introduce ambient air into the tower. The panel 68 includes eight heater transformer fuses 72, a system light 74, a circuit breaker 76, an alarm fault light 78, alarm light disable switch 80, and a main system fuse 82. The tower bottom 30 includes a ring-shaped base plate 62 having a locator pin 64 on its bottom surface. In the center of the bottom 30 is a tubular column 84 with an upper support surface 86.

The base 40 and tower bottom 30 are shown in greater detail in FIG. 4. The base plate 62 of the tower bottom 30 circumscribes and lies in substantially the same plane as the locator plate 44 while resting on the ball bearings 42. The inner surface of the aperture of the base plate 62 is characterized by eight equally spaced inwardly extending tab-like projections 64 which frictionally engage the detents 48. When the tower bottom and the tower are rotated, the force applied will release the projection from the detents. When the projections engage the next succeeding detents, the tower will 'lock' into position. This rotatable movement of the tower facilitates the insertion and removal of the DUT assemblies. A locator pin 64 contacts the stop pin 50 in the base 40. This prevents more than 360° rotation of the tower. The tower therefore rotates less than 360° and 'locks' at seven positions.

Referring to FIGS. 4 and 5, the tower assemblies 16 and 18 are shown in greater detail. The assemblies are substantially identical and only one will be described in detail. The assembly 18 includes a bottom plenum 90 having walls 92 joined to define an octagon. The plenum bottom 90 includes a square aperture 93. Extending up from the plenum are longitudinal members 94 joined to an upper plenum 96, which is identical to 90 but only upside down. The plenums 90 and 96 and members 94 are welded together. Longitudinal column supports 100 are secured to the plenums and walls 102 are secured to the supports 100 to form a rectangular-shaped hollow column in register with the apertures of the plenums. The walls do not extend fully from plenum to plenum. They are spaced apart from the plenums at their ends to define openings through which electrical lines may be brought out of the interior of the column and through which air may flow. The tower assembly 18 is bolted to the support surface 86 of the tower bottom 30 for rotation therewith.

The upper tower assembly 16 is bolted to the lower assembly with spacer bars 106 therebetween at the periphery of the assembly. The apertures of the plenums of the towers 16 and 18 and the columns are in register. Longitudinal supports 110 are secured to the top of the upper plenum 96 of the upper tower assembly 16 for the fan assembly 20 which removes air from the tower 10.

Where the stacked configuration of FIG. 1 is used, half of the electrical and communication lines will extend through the center of the column and into the second tower assembly, which is identical to the first, and then the lines are brought into the upper tower assembly through the space between the bottom of the column and the floor of the tower.

Referring to FIG. 4, one side of the tower is shown with components secured to the column. There are four power packs 130, one power pack for each position on a tray backplane and correspondingly for each position on mother board card. Each power pack comprises three 100 watt switching regulation power supplies at $-12V$, $+5V$ and $+12V$ which provides the power for the driver electronics. Also shown is a DC power supply module 132 for the communications board and a communications board 134. There is one communications board per tower and four DC power supply modules per tower.

Figure 7:
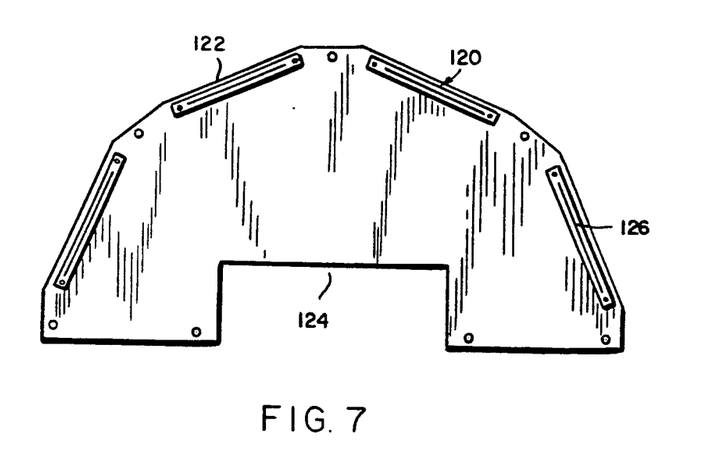
FIG. 7 is a plan view of two tray backplanes.

Referring to FIG. 7, each tray backplane 120 comprises an outer perimeter 122 and an inner U-shaped recess 124. Each backplane comprises four sockets 126 which receive the ribbon connector of a mother board. Each tray backplane 120 as shown services four sides of the tower and therefore, sixteen DUT mother cards as will be described. The electronics of the backplane and associated mother board and daughter board need not be described in detail as this electronics is conventional. The backplanes 120 ar secured at their peripheries to tapped posts extending upwardly from the floor, see FIG. 4.

Figure 8:
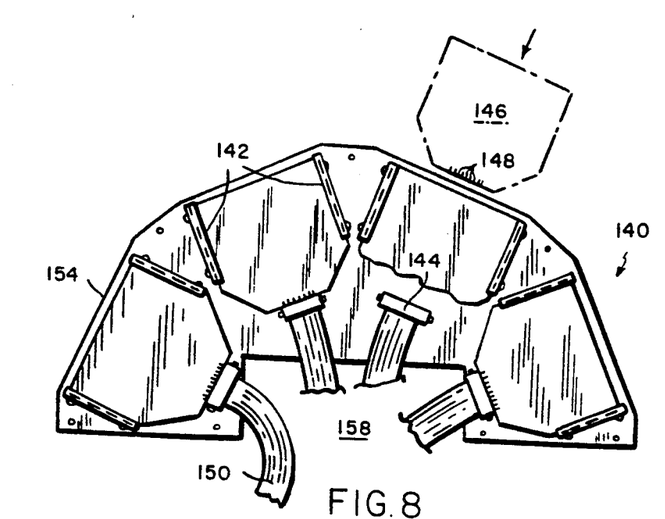
FIG. 8 is a bottom view of one-half of a thermal backplane.

Referring to FIG. 8, a control board backplane 140 (two per tower) is shown. The control backplane 140 is characterized by four pairs of guide rails 142 and four two-way sockets 144. Thermal control boards 146 are received in the guide rails 142 and connected to the control backplane via the sockets 144. The control boards 146 communicate with the thermal conductive modules via a ribbon connector 150.

The control backplanes 140 are secured to the plenum 96 at their perimeters 154 by fasteners secured in tapped projections 156 extending downwardly from the plenum, see FIG. 4. The backplanes 140 include U-shaped recesses 158 and each backplane services four mother boards and therefore, sixteen DUT positions.

Figure 9:
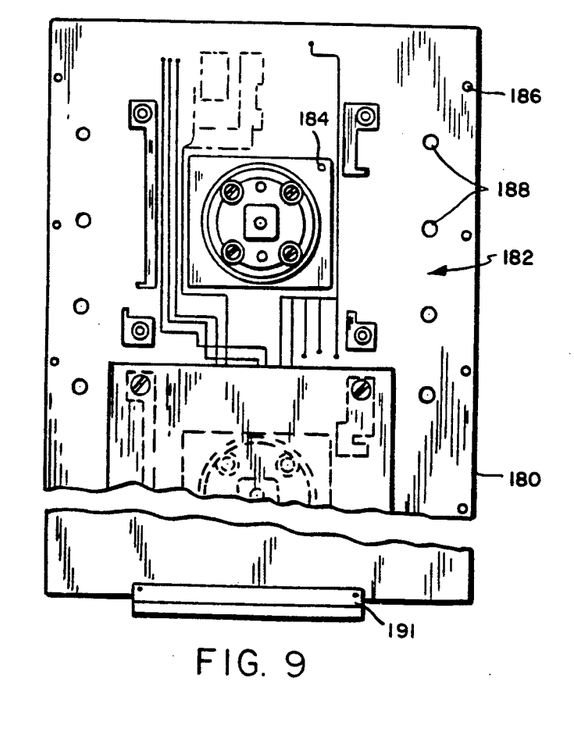
FIG. 9 is a plan fragmentary view of a mother board.

Referring to FIG. 9, a mother board assembly 180 comprises a circuit board 182 which contains the driver electronics and clock cards to apply the load to the DUT at each DUT position, four square apertures 184 and two sets of holes about its perimeter. A first set of holes 186, whereby the assembly is secured to the longitudinal members 94, and an inner set of holes 88 to secure a support pan to the circuit board 182. The four apertures 184 are provided for the thermal conductive modules. The board is further characterized by six sockets 190, see FIG. 10, surrounding each of the apertures 184 and an edge connector 191 which is received in the socket 126 of the tray backplane 120.

Figure 10:
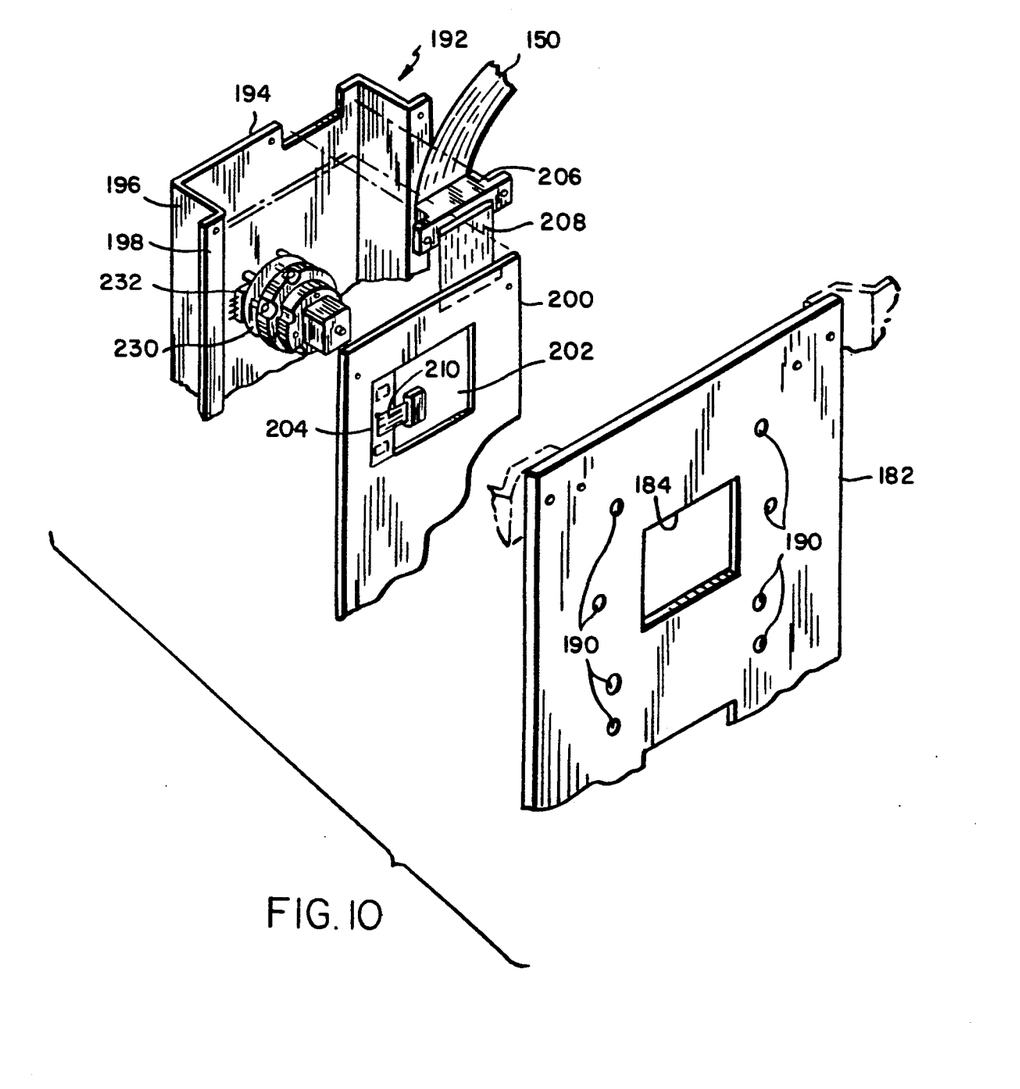
FIG. 10 is a telescopic perspective view of a mother board, conductive module and support pan.

Referring to FIG. 10, secured to the circuit board 182 is a support pan 192 having a bottom 194 and side walls 196 flanged at their upper edges 198 where the pan 192 is fastened to the circuit board via the inner set of holes 188. Secured to the floor of the pan 192 is a circuit board 200 having apertures 202 and sockets 204 for each position. A socket 206 is secured to the edge of the pan 192. The ribbon connector 150 from the control board 146 engage the socket 206. The socket 206 connects to the circuit board 200 via a ribbon connector 208. Four ribbon connectors 210 are secured to the circuit board 200, each of which connects to a thermal conductive module 230.

Secured to the pan 190 by threaded fasteners are four thermal conductive modules 230 (only one shown). These modules 230 have termination strips 232 which engage the ribbon connectors 210.

Figure 11:
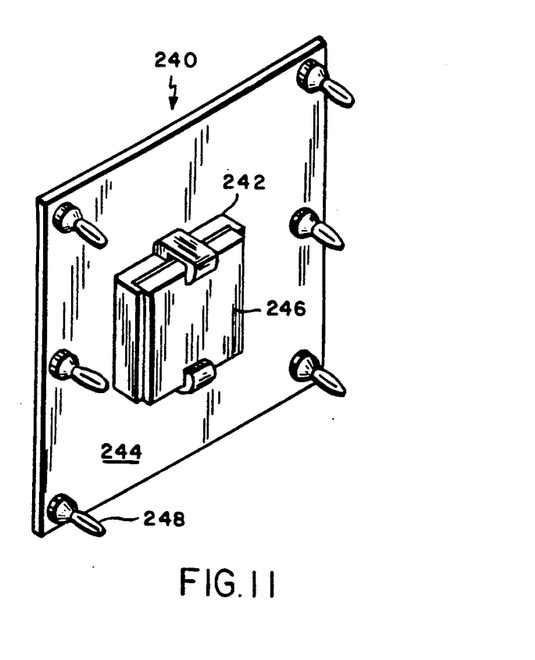
FIG. 11 is a perspective view of a DUT socket assembly.

When the mother board assembly is secured in the tower, its edge connector 188 is received in the socket 126 of the tray backplane 120 and then the sides of the mother board are fastened to the longitudinal members 94 through the outer set of hole 186, see FIGS. 10 and 11.

Referring to FIG. 11, a DUT socket assembly 240 comprises a socket 242, such as a 224 pin ceramic quad, which is secured to a daughter board 244. A device to be tested (DUT), such as a semi-conductor chip 246, is inserted into the socket 242 and during burn-in, the electrical load is applied to the DUT in the usual way. The daughter board 244 has six depending locator pins 248. When the assembly is secured to the mother board the pins are secured in the sockets 190. The circuits on the underside of the daughter board are simply those necessary to carry the load from the mother board 182 to the DUT via the socket/pin connections.

Figure 12:
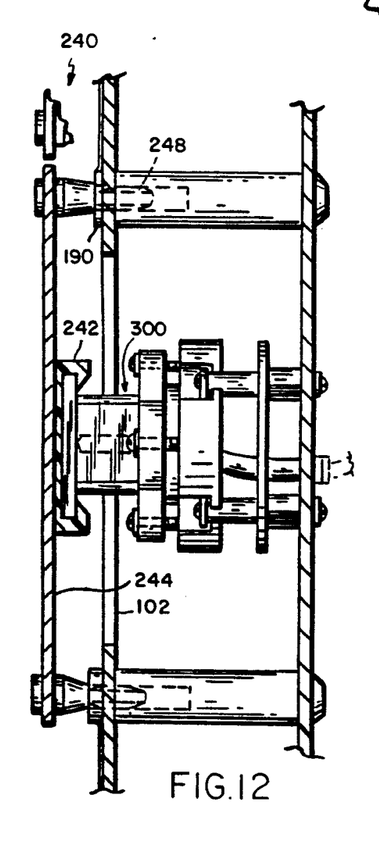
FIG. 12 is side view of a thermal conductive module.
Figure 13:
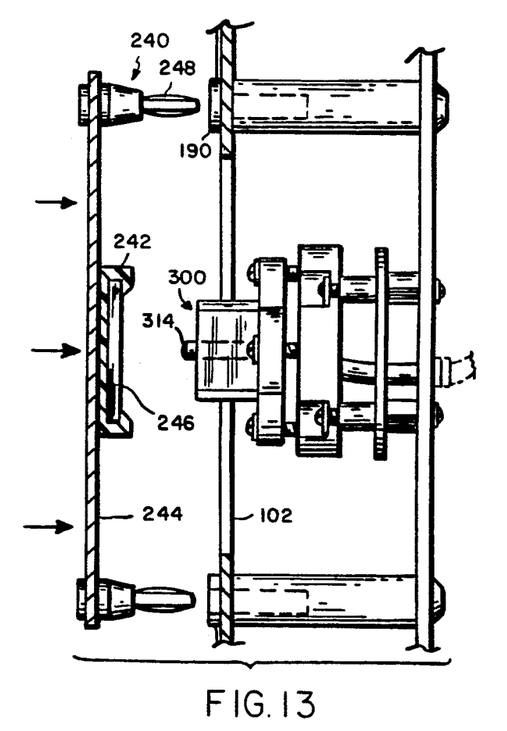
FIG. 13 is a side view of FIG. 12 with an engaged DUT assembly.

Referring to FIGS. 12 and 13, the conductive module 230 is shown with the DUT assembly 240 non-engaged and engaged respectively.

Figure 14:
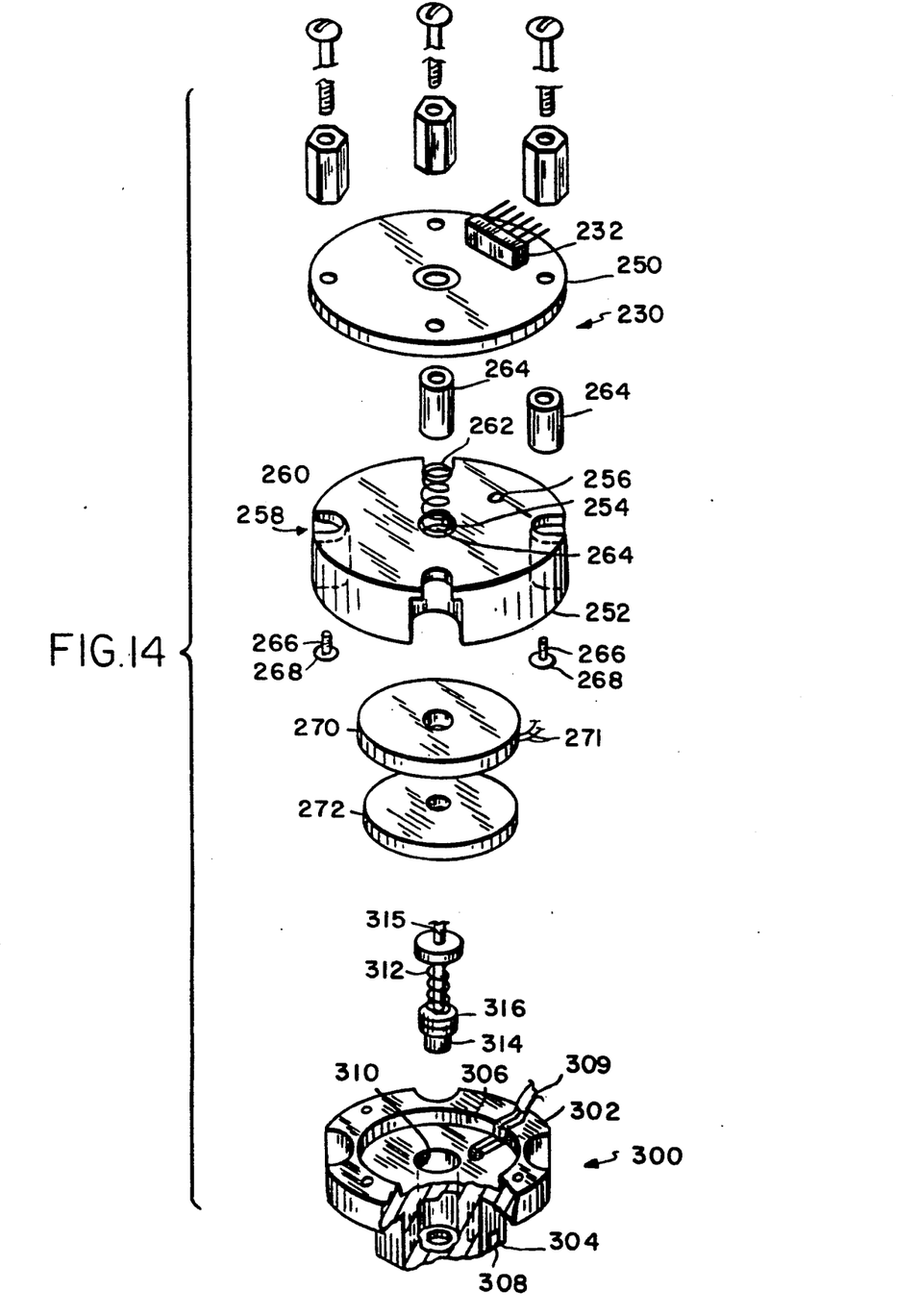
FIG. 14 is a perspective telescopic view of a thermal controller.

Referring to FIG. 14, the module 230 comprises a base plate 250 having the termination strip 232 thereon. A circular plate 252 is spaced apart from and secured to the plate 250. The plate 252 has central opening 254 through which a pair of wires pass and an opening 258 through which two pairs of wires pass. The plate 256 has four semi-circular recessed sides 258. The sides 258 include arc-like flanges 260. The plate 252 is biased away from the plate 250 by a spring 262. The spring 262 is received in a recess 264 of the plate 252 and fits over a depending sleeve (not shown) on the plate 250. Posts 264 (only two shown) are threaded at one end to the plate 250 by fasteners 266 and include flanged heads 268 at the other end. The posts 264 pass through the recesses 258 and the flanged heads 268 on the underside of the plate 254 limit the bias of the plate 252 away from the plate 250 by engaging the underside of the flanges 260. The diameters of the recesses 258 and the flanges 260 are greater than the diameters of the posts 264. Thus, the plate 252 (and components attached thereto) is free to move with a gimbal-like motion. More specifically, the plate moves vertically and also has limited oscillatory motion within th limits defined by the relative differences of the diameters of the posts and recesses, and flanges.

Underlying the plate 252 is a heating element 270, such as a thin film resistance heater having a pair of wires 271, and a heat transfer plate 272, such as an aluminum conductor, each having central apertures through which a pair of wires from a sensor pass.

A heating assembly 300 is fastened to the plate 252 securing the element 270 and plate 272 therebetween in fixed relationship. The assembly 300 comprises an upper plateau-like portion 302 and a depending rectangular heating block 304. The portion 302 includes a disc-shaped recess 306 in which the plate 272 is received. Secured in the heating block 304 is a sensor 308, such as a thermistor. Connected to the thermistor are a pair of wires 309.

The block 304 has a central open passageway 310 and secured therein is a spring 312 secured to the plate 272.

A non-heat conductive disc 316 is secured to the other end of the spring 312. A temperature sensor 314, such as a thermistor, is secured to the disc 316. A pair of wires 315 are joined to the sensor 314. The disc 316 limits the outward bias of the sensor 314. The sensor normally extends through the bottom plane of the portion 304, see FIG. 12. The dimensioning of the sensor 314 within the passageway 310 is such that, regardless of the relative provisions of the portion 302 and the sensor 314 when engaged to a DUT, they do not come in contact with each other. The diameter of the sensor is less than the diameter of the passageway to ensure non-contacting engagement. Slight pivotal movement of the sensor 314 can occur but this movement is limited by the dimension of the disc 316 in the passageway 310 to ensure the sensor cannot contact the heating block 304. The sensor 314 is therefore adapted for limited relative pivotal motion and limited upward vertical motion within the block 304 and this ensures that if a DUT is not properly seated, the sensor may tilt or cant or be otherwise orientated to ensure a flush contact with the DUT.

Similarly, the block 304, which itself is secured to the plate 252 by threaded fasteners (not shown) which pass through the flange of the upper portion 302 and into the plate 252, is also adapted for relative movement with reference to the DUT to ensure flush contact between the heater block 304 and the DUT. When assembled, the plate 252, the heating element 300 and the plates 270 and 272 are secured together as an integral unit. Both the sensor 314 and the heating block 304 are each independently adapted for relative non-contacting movement one to the other to ensure proper contact with the DUT.

The flow of the heat is from the heater 304 to the DU and from the DUT to the sensor 314. The sensor only senses the temperature of the DUT. This sensing is independent of the temperature of the heater. The conductive module 230 includes three pairs of wires, one pair each 309 and 315 from the two sensors 308 and 314 and one pair 271 from the heating element 270. These wires are connected to the termination strip 232.

Figure 15:
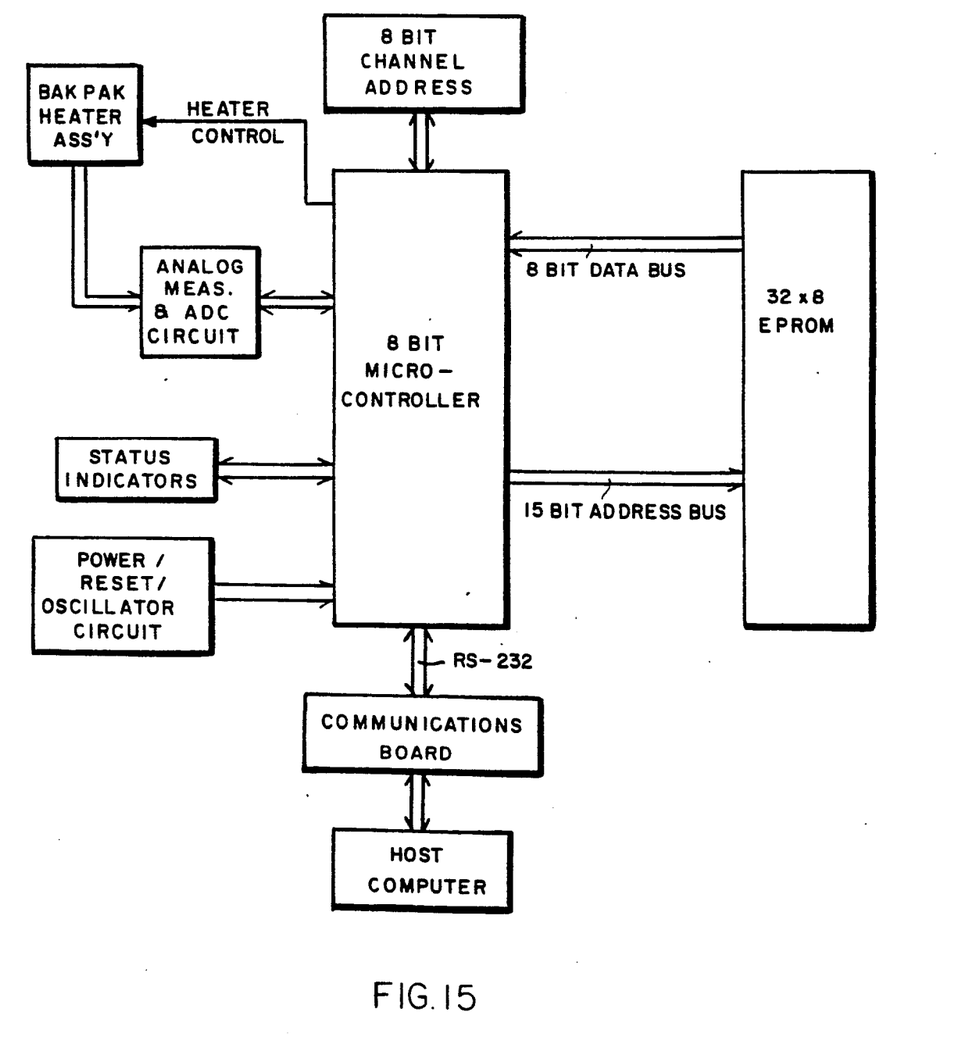
FIG. 15 is a communications system.

Referring to FIG. 15, a function block diagram of one position of a thermal control board is shown. Each thermal control board comprises four microprocessors, each with an associated EPROM. The structure and function of each of the microprocessors and EPROM being identical, only one is shown in detail. The thermal control board comprises the microprocessors, E-proms, and associated analog components to control the temperature level and cycles applied to each of the DUT's.

Figure 16:
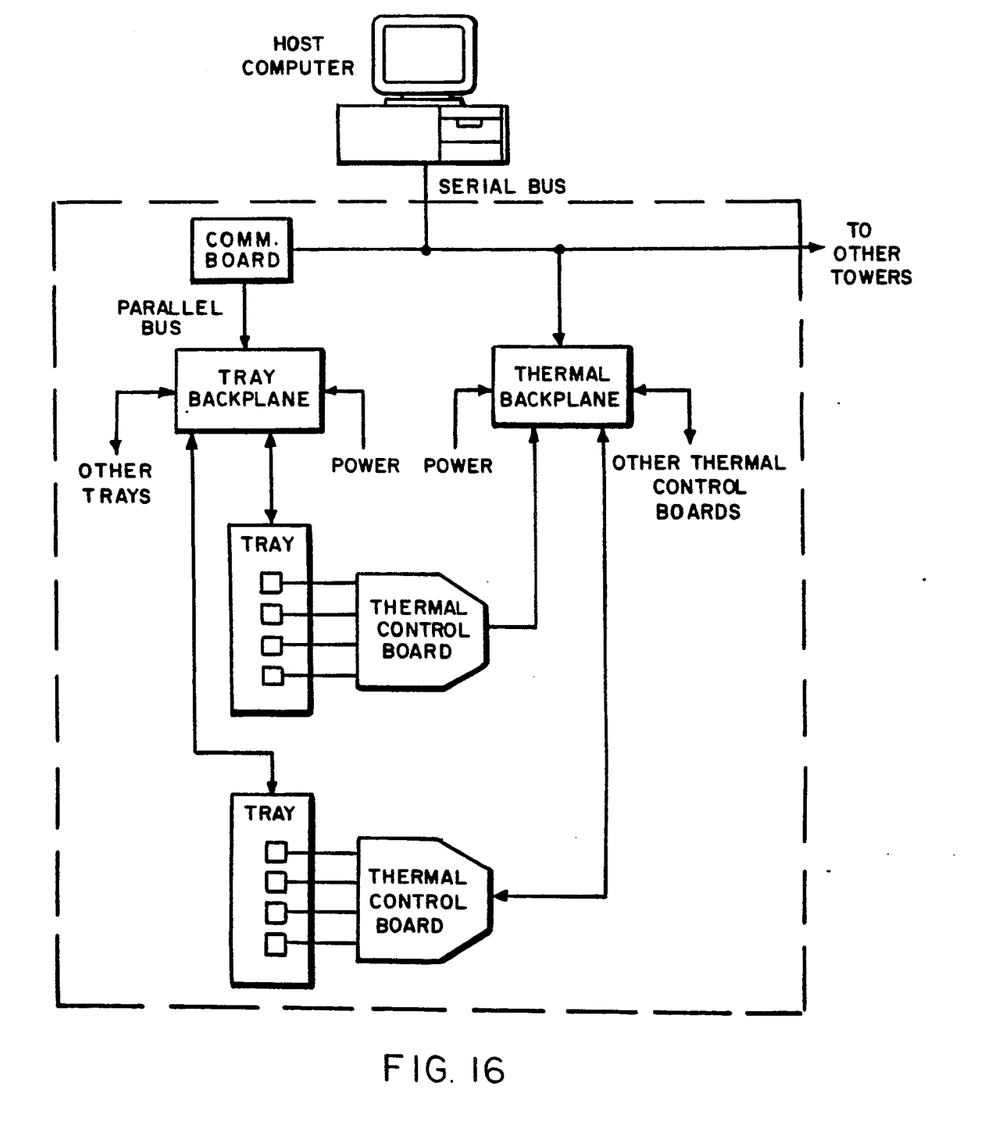
FIG. 16 is a flow diagram of the thermal control board in combination with other system components.

Referring to FIG. 16, a functional block diagram of a communication scheme is shown.

Operation of the Invention

The operation of the invention will be described with reference to the burn-in of a specific device, i.e. an IC, at a single DUT position. As will be apparent from the discussion of the operation of the invention, all sixty-four positions, or some of the sixty-four positions, may be used to burn-in the same type DUTs or different DUTs. That is, each individual DUT position can be programmed to test different components under different conditions. Further, this operation of the invention is described in reference to the system of my copending application. However, it is to be understood that other methods for heating and controlling the temperature of the DUT(s) may be used with the invention of this disclosure.

When a specific type of device is to be tested, a temperature profile of the device is first developed. Establishing a temperature profile involves placing a thermistor or thermocouple at the device junction. The device is inserted into a socket 40. The conductive module engages the socket assembly 30. Heat is applied to the device and several readings at different temperatures are made to determine the actual difference in temperature at the center (junction temperature) and the temperature on the surface of the device (case temperature). It has been found that this profile results in a straight line function. That is, over the temperature range tested, the difference between the case temperature and the junction temperature is the same. Even if it were not a varying difference could be programmed into the microprocessor. For example, depending upon the specific device, the materials of construction and size, the case temperature read by the sensor 112 could be 65° C. while the junction temperature could be 60° C. The junction temperature of the device is the temperature that is desired to be known and controlled. Having determined this temperature difference from the temperature profile for these types of devices, the microprocessor is then programmed such that when the temperature at which the device is to be tested is entered, say 65° C., this temperature will be displayed on the screen. However, in actuality the true temperature reading on the surface of the device (case temperature) will be 70° C. because the actual junction temperature, which is really the temperature being measured, will be the desired 65°. Thus, before any series of devices are tested, a temperature profile for the series is established and the microprocessor programmed to account for this temperature difference.

An IC 246 to be tested is inserted into the socket 242. The socket assembly 240 is brought into engagement with the conductive module 300. Referring to FIGS. 12 and 13, the locator pins 248 are inserted in the sockets 190 in the mother board 102. The sensor 314 contacts the center of the IC such that the face of the sensor 314 remains flush with the surface of the IC. The flush contact is ensured by the ability of the sensor 314 to move within the heating block 300. The face of the heating block 300 is also placed into contacting engagement with the case of the IC and is flush with the surface of the case. This is also possible because the heating block 300 is adapted for gimbal movement as previously described.

It is well known to those skilled in the art that the computer comprises suitable interface, storage and computation units for performing arithmetical and logical functions on data, processed in digital form. Any standard computer language consistent with the capability of the computer can be used with the instructions. The routines may be written in any desired notations, formats or sequence depending upon the particular computer being utilized, computer language, etc. Thus, the computer may be loaded with various programs to accomplish the following steps in the operation of the invention.

The following illustrative parameters are entered into the CPU through the keyboard in response to screen prompts.

1. Select position to be enabled
2. Enter temperature at which device is to be tested
3. Enter maximum and minimum temperatures (±#C)
4. Enter duration of tests 5. Enter temperature steps
6. Enter time steps
7. Enter DUT power dissipation
8 Enter DUT φJC (Optional)

The following is a typical heater set up screen:

| HEATER SET UP SCREEN - TEMPERATURE CYCLING ENABLED | | | |
|---|---|---|---|
| SET UP PARAMETERS 1 2 3 4 5 6 7 8 9 10 11 12 13 14 15 16 FOR HEATER | | CHIP TEMP (°C.) | TIME HHHH:MM) |
| HEATER STATE | LOGGED ON | | |
| HEATER CONTROL | ENABLED | STEP 1: 35 | 0:10 |
|  |  | STEP 2: 45 | 0:20 |
| OVR TEMP DELTA | 10 | STEP 3: 55 | 0:30 |
| IN RANGE ± °C. | 3 | STEP 4: 65 | 0:40 |
| TEMP CYCLING | ENABLED | STEP 5: 75 | 0:50 |
| NUMBER STEPS | 25 | STEP 6: 85 | 1:00 |
| NUMBER CYCLES | 1 | STEP 7: 95 | 1:10 |
|  |  | STEP 8: 105 | 1:20 |
|  |  | STEP 9: 115 | 1:30 |
| CASE STYLE | CERAMIC | STEP 10: 125 | 1:40 |
| COMPENSATE φJC | DISABLED | STEP 11: 135 | 1:50 |
| DUT POWER (mW) | 500 | STEP 12: 145 | 2:00 |
| DEVICE φJC |  | STEP 13: 155 | 2:10 |
|  |  | STEP 14: 145 | 1:00 |
|  |  | STEP 15: 135 | 1:00 |
|  |  | 16: 125 | 0:30 |
|  |  | 17: 115 | 0:30 |
|  |  | 18: 105 | 0:30 |
|  |  | 19: 95 | 0:30 |
|  |  | 20: 85 | 0:30 |
|  |  | 21: 75 | 0:30 |
|  |  | 22: 65 | 0:30 |
|  |  | 23: 55 | 0:30 |
|  |  | 24: 45 | 0:30 |
|  |  | 25: 35 | 0:30 |

In the exemplary heater set-up screen shown above there is provided an optional function φJC. With this φJC function disabled, the user will have displayed and/or printed out temperatures, i.e. 65° C., corresponding to 'case temperatures' as the device case terminology with which the industry is familiar. However, as discussed above the temperature displayed and/or printed out is the actual junction temperature, i.e. 65° C.

The parameter DEVICE φJC refers to the manufacturer's rating of the device, which is a function of the thermal resistance from the junction of the DUT to the case surface.

If the user wishes to measure junction temperature directly, φJC is enabled and the manufacturers rated value, i.e. 15, is input. This value is informational and is displayed and/or printed out. Also, the user will have displayed and/or printed out the set temperature as a junction temperature, i.e. 65° C.

After all parameters have been entered, a designated function key is pressed to start burn-in. This also activates the clock card and associated heaters to apply load to the DUT. The temperature sensed during a cycle is based on the readings from the sensor 314. If this reading violates the preset temperature range, the temperature of the heating block 304 as read by the sensor 308 is raised or lowered and the power to the heating element 270 is increased or decreased. The temperature in the heating block 304 is controlled in response to temperature readings taken by the sensor 314. The case temperature of the DUT is read by the sensor 314.

The applied heat flows by conduction from the heating block 304 through the DUT, and thereafter back to the sensor 314. As previously described, the gimbal construction of the conductive module 230 and the sensor 314 ensures flush contact between the heating block to the DUT, and the DUT to the sensor 314. As a practical matter, this construction eliminates air between the surfaces which would normally create an additional thermal resistance. The temperature profile of the case of the DUT will normally be different from the known temperature profile of the heating block 304. Also, the DUT may experience heat losses to ambient. All of the above contribute to the losses between the temperature applied to the DUT case and the temperature which the junction achieves.

In effect, the process allows the user of the system to set a desired temperature range for the heat to be applied to the DUT junction, which in turn involves setting the heating block 304 to an appropriate level so that the desired junction temperature is achieved. The actual temperature of the DUT case is sensed by sensor 314 and adjustments are made by increasing or decreasing the temperature of the heating block. In light of the heating block temperature being monitored, and under normal conditions knowing the temperature profiles of the heating block and the DUT with the expected losses to ambient, the sensed temperature of the DUT case is converted to a reading corresponding to the desired DUT junction temperature. This temperature value in turn is displayed to the user of the system.

Monitoring information corresponding to the actual test conditions in the form of print outs, screen displays, graphics and/or text is desirable and well within the skill of the art. Also, error signals for manual or automatic disabling of a position(s) is well within the skill of the art.

The foregoing description has been limited to a specific embodiment of the invention. It will be apparent, however, that variations and modification can be made to the invention, with the attainment of some or all of the advantages of the invention. Therefore, it is the object of the appended claims to cover all such variations and modifications as come within the true spirit and scope of the invention.

Having described my invention, what I now claim is:

1. A burn-in tower which comprises:
   a base;
   a skeletal frame defining an outer wall rotatably secured to the base, the frame having a top and a bottom joined to one another in spaced apart relationship by support members, at least one DUT position on the outer wall;
   a DUT socket assembly in said DUT position;
   a thermal conductive module to exchange heat with the DUT at said DUT position;
   means to measure the temperature of the DUT in communication with the module;
   means to control the temperature of the DUT in communication with the module;
   means to control the application of a load to the DUT in communication with the socket assembly;
   means to individually control the load and temperature of each of the DUT positions; and
   means to place the DUT into releasable engagement with the module.

2. The tower of claim 1 wherein the support members are longitudinal spaced apart in parallel relationship and define a plurality of sides.

3. The tower of claim 2 wherein the means to control the load applied to the DUT is secured between adjacent support members.

4. The tower of claim 1 which includes:
a column secured within the frame and wherein the means to control the temperature of the DUT and the power for the means to apply the load to the DUT are secured to the column.

5. The tower of claim 1 which comprises:
first backplanes secured to the frame and second backplanes secured to the frame, the first backplanes having thermal control boards received therein which provide communication between the thermal controller and a microprocessor, and the second backplanes provide communication between a power supply and the means to control the load on the DUT.

6. The tower of claim 1 wherein the conductive module is secured to the tower and extends outwardly through the wall.

7. The tower of claim 6 wherein the means to control the load applied to the DUT comprises a circuit board secured between adjacent members, the circuit board coincident with the plane of the wall and the conductive module extending through said circuit board.

8. The tower of claim 6 wherein the socket assembly is adapted to engage the circuit board whereby the DUT contacts the conductive module.

9. The tower of claim 7 wherein the tower is multi-sided.

10. The tower of claim 9 wherein the tower comprises eight sides.

11. The tower of claim 10 wherein there are four DUT positions on each side.

12. The tower of claim 10 wherein there are first and second frames joined in stacked relationship.

* * * * *